(12) United States Patent
Dosho et al.

(10) Patent No.: US 7,271,648 B2
(45) Date of Patent: Sep. 18, 2007

(54) LADDER FILTER, ANALOG EQUALIZER AND SIGNAL READOUT SYSTEM

(75) Inventors: Shiro Dosho, Osaka (JP); Takashi Morie, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 421 days.

(21) Appl. No.: 10/680,129

(22) Filed: Oct. 8, 2003

(65) Prior Publication Data
US 2004/0070443 A1 Apr. 15, 2004

Related U.S. Application Data

(62) Division of application No. 09/594,153, filed on Jun. 15, 2000, now abandoned.

(30) Foreign Application Priority Data
Jun. 15, 1999 (JP) ............. 11-168872

(51) Int. Cl.
*H03K 5/00* (2006.01)
(52) U.S. Cl. ............. 327/553; 327/552
(58) Field of Classification Search ........ 327/336, 327/552–559
See application file for complete search history.

(56) References Cited

U.S. PATENT DOCUMENTS

| | | | |
|---|---|---|---|
| 4,381,489 A * | 4/1983 | Canning et al. ......... 333/215 |
| 4,823,092 A | 4/1989 | Pennock | |
| 4,839,542 A | 6/1989 | Robinson | |
| 5,257,286 A | 10/1993 | Ray | |
| 5,392,003 A * | 2/1995 | Nag et al. ............. 330/254 |
| 5,596,459 A * | 1/1997 | Kovner et al. ............ 360/51 |
| 6,144,981 A * | 11/2000 | Kovacs et al. ........... 708/819 |
| 6,317,016 B1* | 11/2001 | Kuo ..................... 333/215 |
| 6,369,644 B1* | 4/2002 | Yoshizawa .............. 327/553 |
| 6,838,929 B2* | 1/2005 | Mitteregger ............ 327/553 |
| 7,009,446 B2* | 3/2006 | Yoshida et al. .......... 327/552 |

FOREIGN PATENT DOCUMENTS

| | | |
|---|---|---|
| JP | 50-43860 | 4/1975 |
| JP | 6-61791 | 3/1994 |
| JP | 6-78007 | 3/1994 |
| JP | 6-164314 | 6/1994 |
| JP | 8-274583 | 10/1996 |

OTHER PUBLICATIONS

"A 160 MHz Front-End IC for EPR-IV PRML Magnetic Storage Read Channels", P. Pai et al., 1996 International Solid-State Circuits Conference (1996).

* cited by examiner

*Primary Examiner*—Dinh T. Le
(74) *Attorney, Agent, or Firm*—McDermott Will & Emery LLP

(57) ABSTRACT

A ladder filter includes multiple inductor sections, each including voltage-controlled current sources and capacitors. A second signal input terminal is provided for the filter separately from an ordinary signal input terminal and a signal, which has been input through the second terminal, is supplied to one of the voltage-controlled current sources by way of a gain calculator. By adjusting the gain obtained by the gain calculator to an appropriate value, the ladder filter can make the numerator of its transfer function freely definable.

2 Claims, 16 Drawing Sheets

Fig. 7

$$H_n(s) = \begin{pmatrix} s^6 & s^5 & s^4 & s^3 & s^2 & s^1 & s^0 \end{pmatrix} \begin{pmatrix} a_{00} & 0 & 0 & 0 & 0 & 0 & 0 \\ a_{10} & a_{11} & 0 & 0 & 0 & 0 & 0 \\ a_{20} & a_{21} & a_{22} & 0 & 0 & 0 & 0 \\ a_{30} & a_{31} & a_{32} & a_{33} & 0 & 0 & 0 \\ a_{40} & a_{41} & a_{42} & a_{43} & a_{44} & 0 & 0 \\ a_{50} & a_{51} & a_{52} & a_{53} & a_{54} & a_{55} & 0 \\ a_{60} & a_{61} & a_{62} & a_{63} & a_{64} & a_{65} & a_{66} \end{pmatrix} \begin{pmatrix} gm_0 \\ gm_1 \\ gm_2 \\ gm_3 \\ gm_4 \\ gm_5 \\ gm_6 \end{pmatrix}$$

$$\underbrace{\phantom{s^6}}_{S} \quad \underbrace{\phantom{AAAAAAA}}_{A} \quad \underbrace{\phantom{gm}}_{Gm}$$

Fig. 8

$$\begin{pmatrix} gm6 \\ gm5 \\ gm4 \\ gm3 \\ gm2 \\ gm1 \\ gm0 \end{pmatrix} \Rightarrow Gm = \begin{pmatrix} a60 & a61 & a62 & a63 & a64 & a65 & a66 \\ a50 & a51 & a52 & a53 & a54 & a55 & 0 \\ a40 & a41 & a42 & a43 & a44 & 0 & 0 \\ a30 & a31 & a32 & a33 & 0 & 0 & 0 \\ a20 & a21 & a22 & 0 & 0 & 0 & 0 \\ a10 & a11 & 0 & 0 & 0 & 0 & 0 \\ a00 & 0 & 0 & 0 & 0 & 0 & 0 \end{pmatrix} \Rightarrow A \begin{pmatrix} K6 \\ K5 \\ K4 \\ K3 \\ K2 \\ K1 \\ K0 \end{pmatrix} \Rightarrow K$$

filter network of cascaded biquadratic filters ladder filter

LADDER FILTER, ANALOG EQUALIZER AND SIGNAL READOUT SYSTEM

This application is a divisional of Application Ser. No. 09/594,153 filed Jun. 15, 2000 now abandoned.

BACKGROUND OF THE INVENTION

The present invention relates to an analog filter for use in a signal readout system for a magnetic or magneto-optical disk, for example.

As magnetic/magneto-optical disk technologies have been remarkably developed in recent years, it has become increasingly necessary to further improve the signal processing technology applicable to reading signals therefrom.

FIG. 12 illustrates a known magnetic/magneto-optical disk signal readout system. A signal, read out from a disk 80, is amplified by an amplifier 81 first, and then passed through an analog filter 82 so as to have its noise reduced and its gain boosted. As used herein, "gain boosting" means a signal processing technique of sharpening the edges of a signal by boosting the high-frequency components thereof. Then, the analog output signal of the analog filter 82 is converted into a digital signal by a data slicer 83. A recent system sometimes decodes an A/D converted signal by a maximum likelihood method. Even in such a system, however, the performance required for its analog filter is much the same.

FIG. 13 illustrates ordinary frequency characteristics of an analog filter for use in a signal readout system for a magnetic or magneto-optical disk. In constructing a signal readout system for a magnetic or magneto-optical disk, its analog filter is usually designed using a Bessel filter or an equal-ripple filter so as to sharpen the signal edges and so as not to distort the signal waveform. This is because should the analog filter distort the signal waveform, the locations of the signal edges displace, thus possibly causing errors in digitizing a signal using a data slicer.

Accordingly, an analog filter is designed such that its transfer function H(s) is given by the following Equation (1)

$$H(s)=(1-s^2)/D(s)=(1+\omega^2)/D(j\omega) \quad (1)$$

where s is a Laplace variable and D(s) is a function representing the denominator of the transfer function of the analog filter. In this case, the numerator of the transfer function H(s) has no imaginary part and therefore does not affect the phase characteristic of the analog filter. In addition, since the high-frequency gain is boosted by the term $\omega^2$, the gain-boosted characteristic such as that illustrated in FIG. 13 is obtained.

A filter with the gain-boosted characteristic such as that illustrated in FIG. 13 is implementable by a cascade of biquadratic filters such as those illustrated in FIG. 14. A biquadratic filter usually has quadratic poles. However, if two such filters are cascaded as shown in FIG. 14, then quadratic poles and first zeroes can be easily made in their transfer function. That is to say, the transfer function of each of the biquadratic filters shown in FIG. 14 is given by the following Equation (2):

$$H1(s)=(gm1 \cdot gm2+sC2 \cdot gm1x)/(gm2^2+sC \cdot gm3+s^2C1C2) \quad (2)$$

Thus, the transfer function H(s) of the cascade of the two biquadratic filters shown in FIG. 14 is given by the following Equation (3):

$$H(s)=\{(gm1 \cdot gm2)^2-s^2\}/(gm2^2+sC2 \cdot gm3+s^2C1C2)^2 \quad (3)$$

In this manner, a transfer function having no imaginary part in its numerator and yet having the term $\omega^2$ can be obtained, thus easily realizing the gain-boosted characteristic.

A filter network implemented as a cascade of biauadratic filters, however, has its characteristic easily affected by the variation of its components.

FIG. 15 illustrates a Laplace plane representing the characteristic of an analog filter. The characteristic of an analog filter can usually be represented using a collection of poles and zeroes on a Laplace plane. In the following description, however, the characteristic of an analog filter will be regarded as a consisting of poles for the sake of simplicity.

As shown in FIG. 15, a frequency vector is represented as s=jω and its end point rises along the imaginary axis of the Laplace plane as the frequency increases. On the other hand, the frequency characteristic of an analog filter is given by $$H(s)=\Pi_{k=1}^n 1/(s-sk)$$

where sk is a vector representing the position of each pole on the Laplace plane. Thus, a frequency gain is an inverse of the product of the vector (s−sk). That is to say, the frequency characteristic of an analog filter is more likely to be affected by a relatively short vector (s−sk). In other words, the frequency characteristic of the filter is affected most by the position of a pole Sk that is closest to the imaginary axis. Also, the position of a pole displaces on the Laplace plane due to the characteristic variations of filter components.

In an analog filter network implemented as a cascade of biquadratic filters, a pair of poles is realized by each of these biquadratic filters. Thus, as shown in FIG. 16(a), the characteristic variation of a biquadratic filter BQ1 realizing the pairs of poles closest to the imaginary axis is a key factor of the variable characteristic of the analog filter network. Accordingly, the frequency characteristic of such a cascade of biquadratic filters is easily affected by the characteristic variation of its components.

An analog filter may also be implemented as a ladder filter. In a ladder filter, capacitors and inductors are connected together in a ladder shape and its input and output are terminated with resistors. In an LSI, an inductor is usually non-implementable, and therefore is replaced with an equivalent circuit including voltage-controlled current sources and capacitors, thereby constructing a ladder filter. In such a case, the ladder filter is implemented with plural biquadratic filters all coupled together.

Accordingly, in a ladder filter, the positions of all the poles are affected by the characteristic variations of its components. Thus, as shown in FIG. 16(b), if the characteristics of its components vary, then the positions of all the poles change. However, the magnitude of the displacement itself is much smaller compared to the cascade of biquadratic filters. Also, the displacement of the poles closest to the imaginary axis, which affects the frequency characteristic most seriously, becomes relatively small, too. Accordingly, the ladder filter does not have its characteristic affected by the characteristic variations of its components so much as the cascade of biquadratic filters.

However, the ladder filter is essentially a filter network of passive components. Thus, it has been widely believed that it is difficult to increase its gain to ½ or more or to realize the gain-boosted characteristic as illustrated in FIG. 13.

SUMMARY OF THE INVENTION

It is therefore an object of the present invention to provide an analog filter exhibiting a gain-boosted characteristic, which is almost consistent even against the characteristic variations of its components.

Specifically, an inventive ladder filter includes multiple inductor sections, each being implemented by an equivalent circuit including voltage-controlled current sources and capacitors. A signal input to the ladder filter is provided to at least one of the voltage-controlled current sources by way of gain adjusting means. A gain obtained by the gain adjusting means is set to such a value as realizing a desired transfer function for the ladder filter.

In the inventive ladder filter, which exhibits a highly consistent filter characteristic even against the characteristic variations of its components, a signal input to the ladder filter is provided to at least one of the voltage-controlled current sources in the inductor sections by way of the gain adjusting means. As a result, even a transfer function, which has been hard to realize in a conventional ladder filter, is also realizable. For example, by setting the ratio of the gains obtained by the gain adjusting means to such a value that the transfer function of the ladder filter has a numerator consisting of only a term that is an even-numbered power of s, e.g., $(1+s^2)$, the ladder filter can vary only its gain characteristic while keeping its phase characteristic substantially constant.

In one embodiment of the present invention, a ratio of the gains obtained by the gain adjusting means is preferably set to such a value as making the ladder filter exhibit a desired gain-boosted characteristic independent of its phase characteristic.

In another embodiment, the inventive ladder filter may further include a first signal input terminal provided for a filtering process and a second signal input terminal provided separately from the first signal input terminal. The gain adjusting means preferably receives a signal that has been input to the second signal input terminal.

In this particular embodiment, the inventive ladder filter preferably further includes a variable-gain amplifier provided at a stage preceding the second signal input terminal.

In still another embodiment, a variable gain is preferably obtained by the gain adjusting means.

An inventive analog equalizer includes: a ladder filter including multiple inductor sections, each being implemented by an equivalent circuit including voltage-controlled current sources and capacitors; means for detecting an error between an output signal of the ladder filter and a reference signal; and means for changing a filter characteristic of the ladder filter by reference to the error that has been detected by the detecting means. A signal input to the ladder filter is provided to at least one of the voltage-controlled current sources by way of gain adjusting means, which obtains a variable gain. The changing means changes the gain, obtained by the gain adjusting means of the ladder filter, based on the error that has been detected by the detecting means.

An inventive signal readout system includes the analog equalizer of the present invention, reads out a signal from a recording medium such as a magnetic or magneto-optical disk and filters the signal using the analog equalizer.

BRIEF DESCRIPTION OF THE DRAWINGS

FIG. 7 illustrates a determinant representing the numerator of a transfer function for the filter shown in FIG. 6.

FIG. 8 illustrates a modification of the determinant shown in FIG. 7.

FIG. 16($b$) illustrates the characteristic of a ladder filter.

DESCRIPTION OF THE PREFERRED EMBODIMENTS

Embodiment 1

Figure 1:
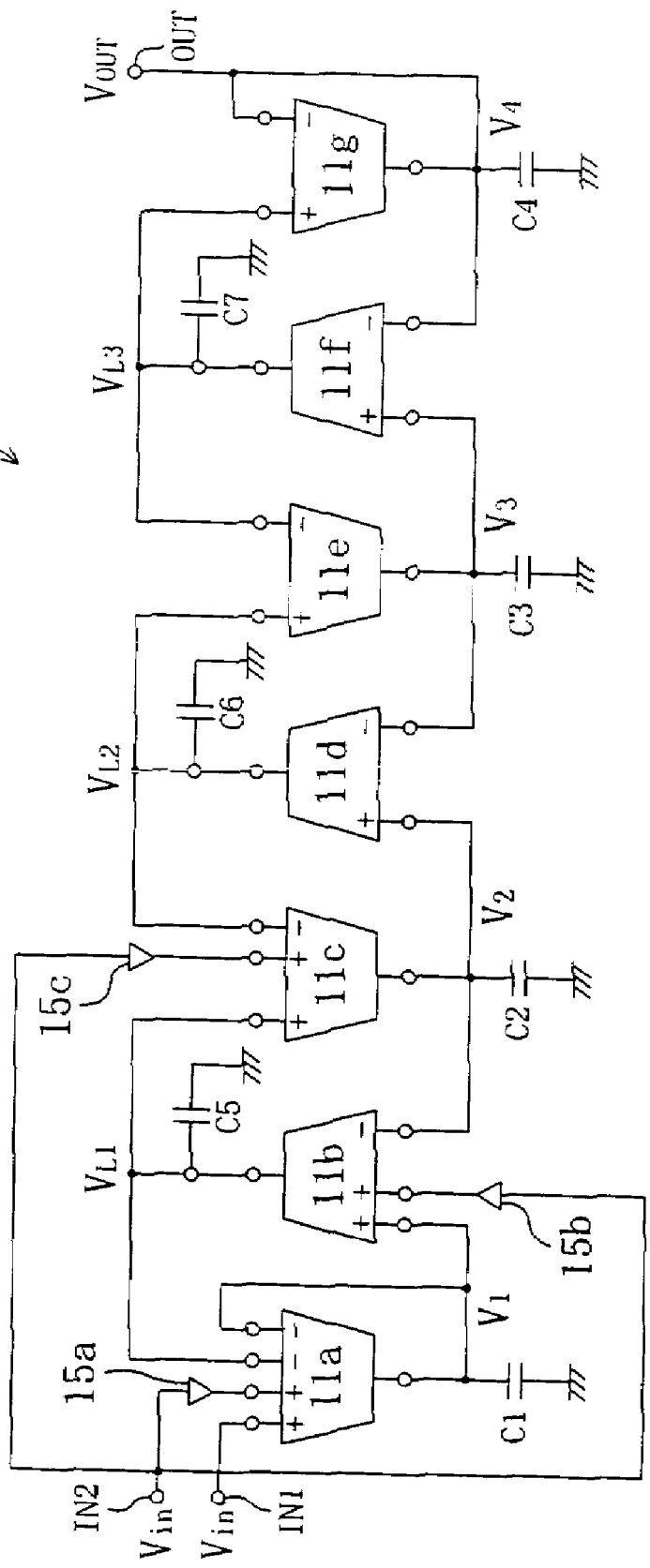
FIG. 1 illustrates a configuration for a ladder filter according to a first embodiment of the present invention.

FIG. 1 illustrates a configuration for a ladder filter 1 according to a first embodiment of the present invention. The ladder filter 1 shown in FIG. 1 is a $7^{th}$-order equal-ripple filter and realizes a gain-boosted characteristic independent of its phase characteristic.

Figure 2:
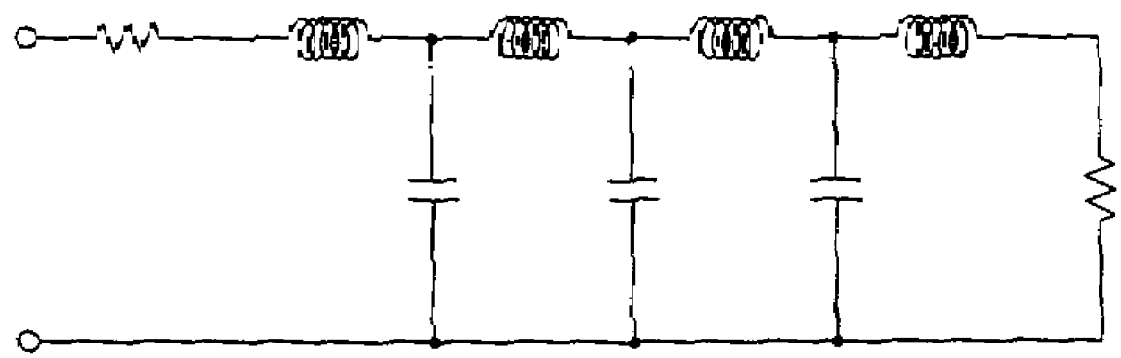
FIG. 2 is a circuit diagram illustrating a prototype of the ladder filter.
Figure 3:
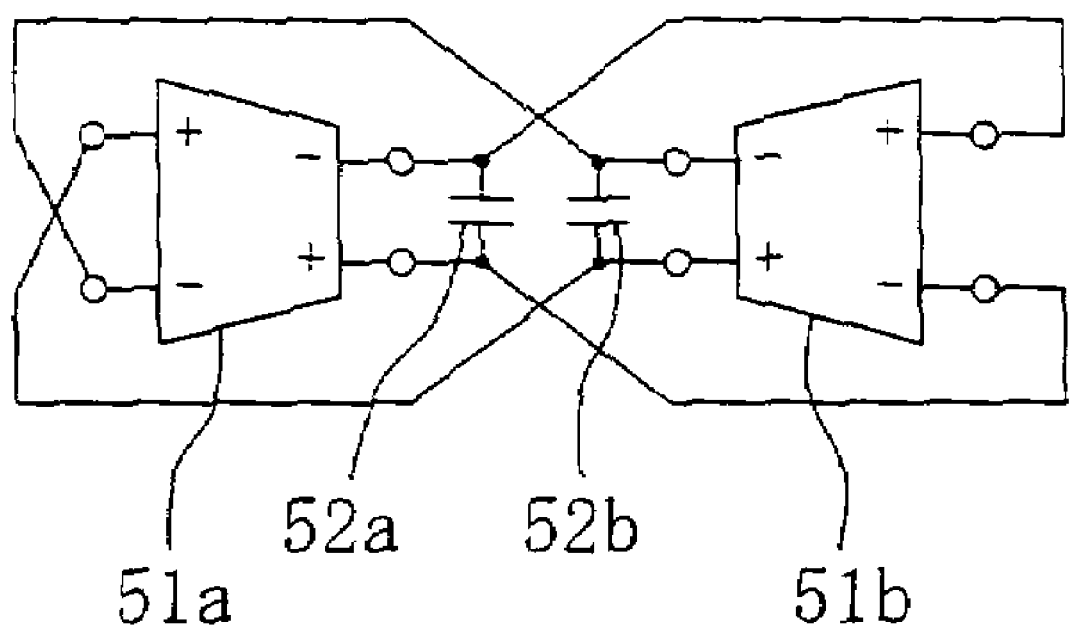
FIG. 3 is an equivalent circuit diagram of an inductor section for the ladder filter.

FIG. 2 is a circuit diagram illustrating a prototype for the ladder filter 1 and FIG. 3 illustrates an equivalent circuit of an inductor section for the ladder filter 1. As shown in FIG. 3, the equivalent circuit includes voltage-controlled current sources 51$a$ and 51$b$ and capacitors 52$a$ and 52$b$. That is to say, the ladder filter 1 shown in FIG. 1 includes multiple inductor sections, each of which is implemented by the equivalent circuit shown in FIG. 3.

As shown in FIG. 1, the ladder filter 1 includes ordinary signal input terminal IN1, signal output terminal OUT, voltage-controlled current sources 11$a$ through 11$g$ and capacitors C1 through C7. The ladder filter 1 shown in FIG. 1 is characterized by further including a second signal input terminal IN2 in addition to the signal input terminal IN1. And the filter 1 is so constructed as providing a signal Vin, which has been input to the signal input terminal IN2, to the first through third voltage-controlled current sources 11$a$ through 11$c$ via constant-ratio gain calculators 15$a$ through 15$c$ (which are exemplary gain adjusting means), respectively.

Without the second signal input terminal IN2, the ladder filter 1 shown in FIG. 1 will have a transfer function of a $7^{th}$-order equal-ripple filter. The denominator of this transfer function is determined by the feedback characteristic of the circuit. However, even if the number of signal input terminals is increased, the feedback characteristic of the circuit does not change. Accordingly, the denominator of the transfer function does not change whether the second signal input terminal IN2 is added or not. That is to say, only the numerator term of the transfer function of the ladder filter is affected by the addition of the second signal input terminal IN2.

Thus, if the input signal Vin is provided to any of the voltage-controlled current sources 11a through 11g separately from the ordinarily input signal with its input gain appropriately controlled, then the transfer function of the ladder filter will have a freely modifiable numerator. As a result, a filter with any of various response characteristics will be obtainable in that case. That is to say, by taking advantage of a technical concept like this, a ladder filter according to this embodiment realizes a desired gain-boosted characteristic independent of its phase characteristic.

Unless the second signal input terminal IN2 is provided, the ladder filter 1 shown in FIG. 1 may have a transfer function H(s) given by the following Equation (4):

$$H(s)=0.5/Hr(s)=0.5/(1.000000000s^7+5.233611506s^6+ \\ 19.69755040s^5+45.91809198s^4+76.50647398s^3+ \\ 84.06826807s^2+57.09056406s+17.97359538) \quad (4)$$

It should be noted that the cutoff frequency is normalized at 1 Hz for the sake of simplicity and
R=1
gm=1
C1=2.28476155
C2=0.874875016
C3=0.6653020972
C4=0.208510173
C5 (=L1)=1.06718322
C6 (=L2)=0.7521265315 and
C7 (=L3)=0.4999563649

Since the transconductance gm is one, the capacitance values of the capacitors C5 through C7 are equal to those of L1 through L3, respectively. If the cutoff frequency has changed, then the transfer function may be transformed in accordance with a known frequency scaling formula as in an ordinary filter design process.

Supposing the gains obtained by the respective constant-ratio gain calculators 15a through 15c are denoted by gin, gm1 and gm2, the transfer function of the ladder filter 1 shown in FIG. 1 will have a numerator Hn(s) given by the following Equation (5):

$$Hn(s)=1.219129594gm2s^2+(1.142380774gm1+ \\ 0.5335916099gm2)s+(0.5gm2+0.5gm1+0.5gin+ \\ 0.5) \quad (5)$$

If the $0^{th}$ and $1^{st}$-order terms of the numerator Hn(s) are 0.5 and 0, respectively, then the gain-boosted characteristic is realized and the circuit shown in FIG. 1 will be a gain booster. Thus, the ladder filter 1 shown in FIG. 1 can exhibit the gain-boosted characteristic when the respective gains gin, gm1 and gm2 meet the relationships represented by the following Equations (6):

$$1.142380774gm1+0.5335916099gm2=0$$

$$0.5gm2+0.5gm1+0.5gin=0 \quad (6)$$

If these Equations are solved, then $$gm2=-2.140927168gm1$$

$$gin=1.140927168gm1$$

$$\therefore Hn(s)=-2.61gm1s^2+0.5 \quad (7)$$

Thus, the ladder filter 1 shown in FIG. 1 has a transfer function H(s) given by the following Equation (8):

$$H(s)=(-2.61gm1s^2+0.5)/Hr(s) \quad (8)$$

As can be seen from this transfer function H(s) equation, a desired gain-boosted characteristic is attainable by setting the gain gm1 obtained by the constant-ratio gain calculator 15b to an appropriate value and the boosted gain is changeable by adjusting the gain gm1.

By providing an additional input signal to a voltage-controlled current source separately from an ordinarily input signal and by appropriately controlling the gain ratio in this manner, this embodiment realizes a desired gain characteristic without disturbing its phase characteristic.

The ladder filter 1 shown in FIG. 1 is also characterized in that the signal input to the first voltage-controlled current source 11a is not Vin·gin but (Vin+Vin·gin). If Vin·gin is simply input, then the transfer function H(s) given by Equation (8) is not realizable.

In other words, to make only the gain-boosted characteristic controllable independently, (Vin+Vin·gin) should be input to the first voltage-controlled current source 11a. This is because if Vin·gin is input to the first voltage-controlled current source 11a, then it is impossible to control only the gain-boosted characteristic independently.

Embodiment 2

Figure 4:
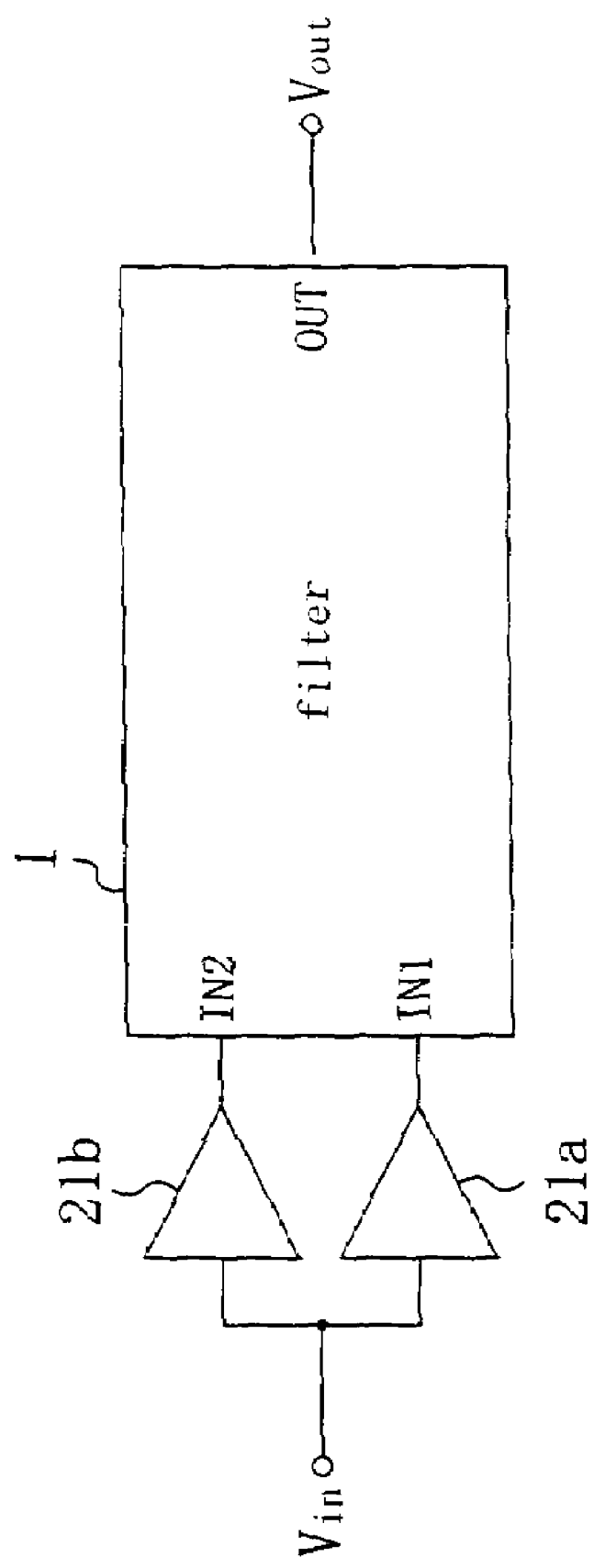
FIG. 4 illustrates a ladder filter according to a second embodiment of the present invention.

FIG. 4 illustrates a ladder filter according to a second embodiment of the present invention. As shown in FIG. 4, the ladder filter according to this embodiment further includes first and second variable-gain amplifiers 21a and 21b at a stage preceding the input terminals IN1 and IN2 of the ladder filter 1 of the first embodiment.

By adjusting the gain of the second variable-gain amplifier 21b, the intensity of the signal input to the second signal input terminal IN2 is controllable independent of the signal input to the first signal input terminal IN1. Accordingly, as can be seen from the transfer function H(s) equation (8), the boosted gain of the ladder filter 1 is easily changeable. That is to say, by dividing the variable-gain amplifier preceding the input stage into two, the boosted gain of the ladder filter is controllable independent of the gain control for an ordinarily input signal.

In addition, since the gains are controlled using the variable-gain amplifiers 21a and 21b, the boosted gain can be changed more smoothly compared to using a switch, for example.

Embodiment 3

Figure 5:
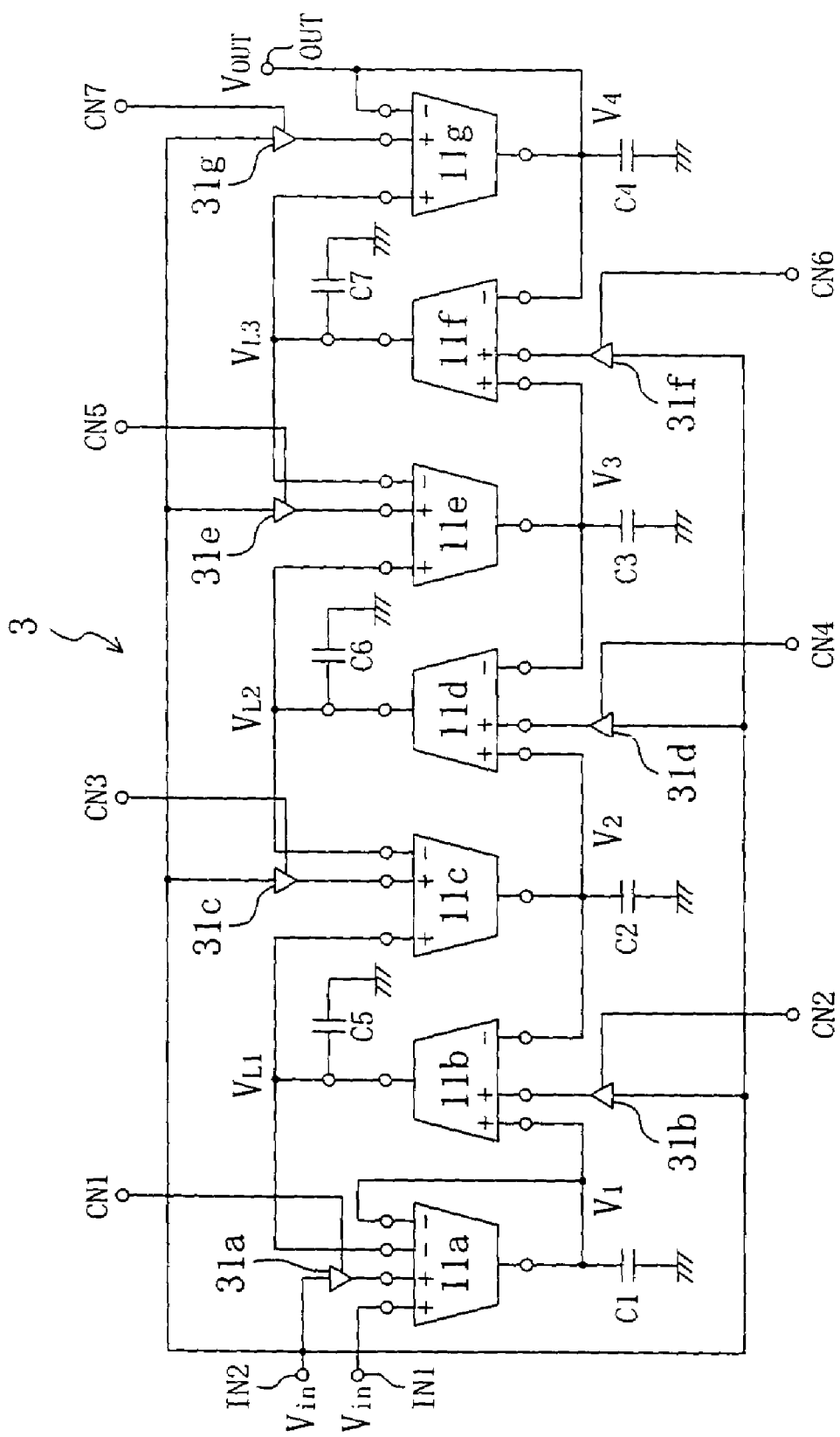
FIG. 5 illustrates a configuration for a ladder filter according to a third embodiment of the present invention.

FIG. 5 illustrates a configuration for a ladder filter 3 that realizes a desired transfer function according to a third embodiment of the present invention. In FIG. 5, the same components as the counterparts shown in FIG. 1 are identified by the same reference numerals and the description thereof will be omitted herein.

The ladder filter 3 shown in FIG. 5 is characterized in that the signal received at the second signal input terminal IN2 is provided to all of the voltage-controlled current sources 11a through 11g via the constant-ratio gain calculators 31a through 31g (which are exemplary gain adjusting means), respectively. The filter 3 is also characterized in that the gains obtained by the constant-ratio gain calculators 31*a* through 31*g* are controllable through respective gain control terminals CN1 through CN7.

As described in the first embodiment, in a ladder filter with multiple inductors, each implemented as an equivalent circuit consisting of voltage-controlled current sources and capacitors, the input signal Vin is provided to any of the voltage-controlled current sources 11*a* through 11*g* separately from the ordinarily input signal. And its input gain is adjusted appropriately, thereby freely controlling the numerator of its transfer function. That is to say, a desired transfer function is realizable for the ladder filter 3 shown in FIG. 5 by controlling the gains of the constant-ratio gain calculators 31*a* through 31*g* through the gain control terminals CN1 through CN7, respectively.

The ladder filter 3 shown in FIG. 5 is applicable to an equalizer, for example. By using the filter shown in FIG. 5, a downsized equalizer with more consistent characteristic is obtained.

Figure 6:
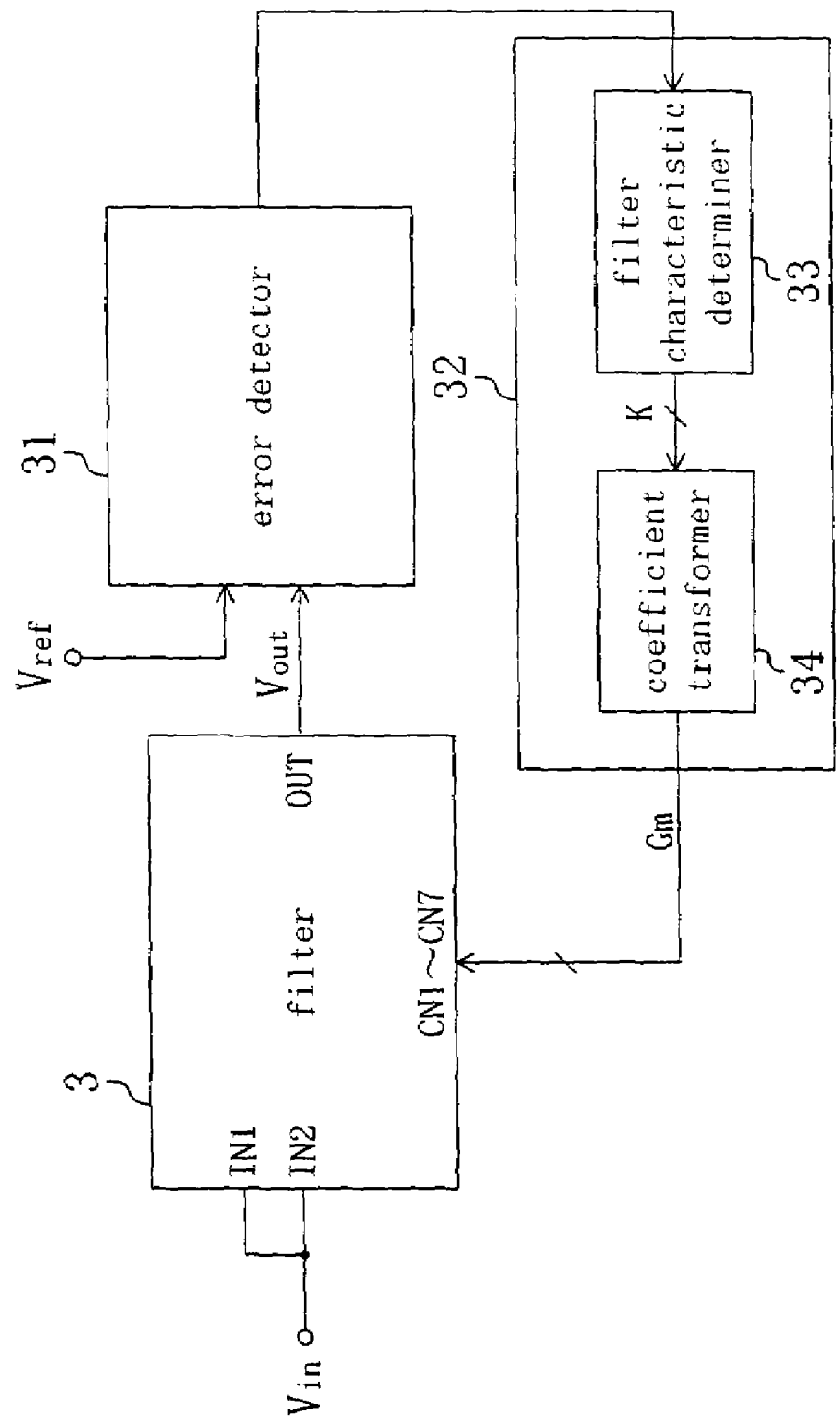
FIG. 6 illustrates a configuration for an analog equalizer according to the third embodiment.

FIG. 6 illustrates a configuration for an analog equalizer including the ladder filter 3 shown in FIG. 5 according to the third embodiment. As shown in FIG. 6, the equalizer further includes an error detector 31 and a filter characteristic changer 32. Receiving the output signal Vout of the ladder filter 3 and a reference signal Vref, the error detector 31 detects and outputs an error between these signals. In response to the output signal of the error detector 31, the filter characteristic changer 32 changes the response characteristic (filter characteristic) of the ladder filter 3.

The ladder filter 3 may have the numerator Hn(s) of its transfer function represented by a determinant shown in FIG. 7. In FIG. 7, the determinant includes three matrices Gm, A and S. The matrix Gm represents the gain settings gm0 through gm6 of the respective constant-ratio gain calculators 31*a* through 31*g*. The matrix A represents the response of the filter 3. And the matrix S consists of powers of a Laplace variable s.

A determinant shown in FIG. 8 is obtained from the determinant shown in FIG. 7. In FIG. 8, K is a matrix representing the $0^{th}$ through $6^{th}$-order coefficient values K0 through K6 of Hn(s). Accordingly, the gain Gm that should be obtained to define a numerator polynomial of Hn(s) with respect to an arbitrary coefficient value K is given by $$Gm = (A^T)^{-1} \times K$$

In the equalizer shown in FIG. 6, the filter characteristic changer 32 includes: a filter characteristic determiner 33 for determining the coefficient K for the filter characteristic; and a coefficient transformer 34 for determining the gain coefficient Gm of the ladder filter 3 by the value of the coefficient K. In this way, the gain coefficient Gm can be determined such that the ladder filter 3 shows arbitrary response.

The respective elements of the matrix A can be obtained in the following manner. For example, the elements $a_{66}$, $a_{65}$, $a_{64}$, $a_{63}$, $a_{62}$, $a_{61}$ and $a_{60}$ on the first row of the matrix A are coefficients for respective orders in the numerator of the transfer function when the input signal Vin is provided only to the seventh voltage-controlled current source 11*g* via the constant-ratio gain calculator 31*g* in the filter shown in FIG. 5. Accordingly, in that case, the input signal Vin should not be input through the ordinary signal input terminal IN1, the gains of the first through sixth constant-ratio gain calculators 31*a* through 31*f* should be set to zero and only the gain of the seventh constant-ratio gain calculator 31*g* should be set to one. Then, the transfer function of the ladder filter 3 should be derived from the output signal Vout in that case. And the coefficients for respective orders in its numerator may be regarded as the elements $a_{66}$, $a_{65}$, $a_{64}$, $a_{63}$, $a_{62}$, $a_{61}$ and $a_{60}$ on the first row of the matrix A.

In the same way, the elements $a_{55}$, $a_{54}$, $a_{53}$, $a_{52}$, $a_{51}$ and $a_{50}$ on the second row of the matrix A are coefficients for respective orders in the numerator of the transfer function when the input signal Vin is input only to the sixth voltage-controlled current source 11*f* via the constant-ratio gain calculator 31*f*. Accordingly, in that case, the input signal Vin should not be input through the ordinary signal input terminal IN1, the gains of the first through fifth and seventh constant-ratio gain calculators 31*a* through 31*e* and 31*g* should be set to zero and only the gain of the sixth constant-ratio gain calculator 31*f* should be set to one. Then, the transfer function of the ladder filter 3 should be derived from the output signal Vout in that case. And the coefficients for respective orders in its numerator may be regarded as the elements $a_{55}$, $a_{54}$, $a_{53}$, $a_{52}$, $a_{51}$ and $a_{50}$ on the second row of the matrix A. The other matrix elements from the third row on can be obtained in a similar manner.

Figure 9:
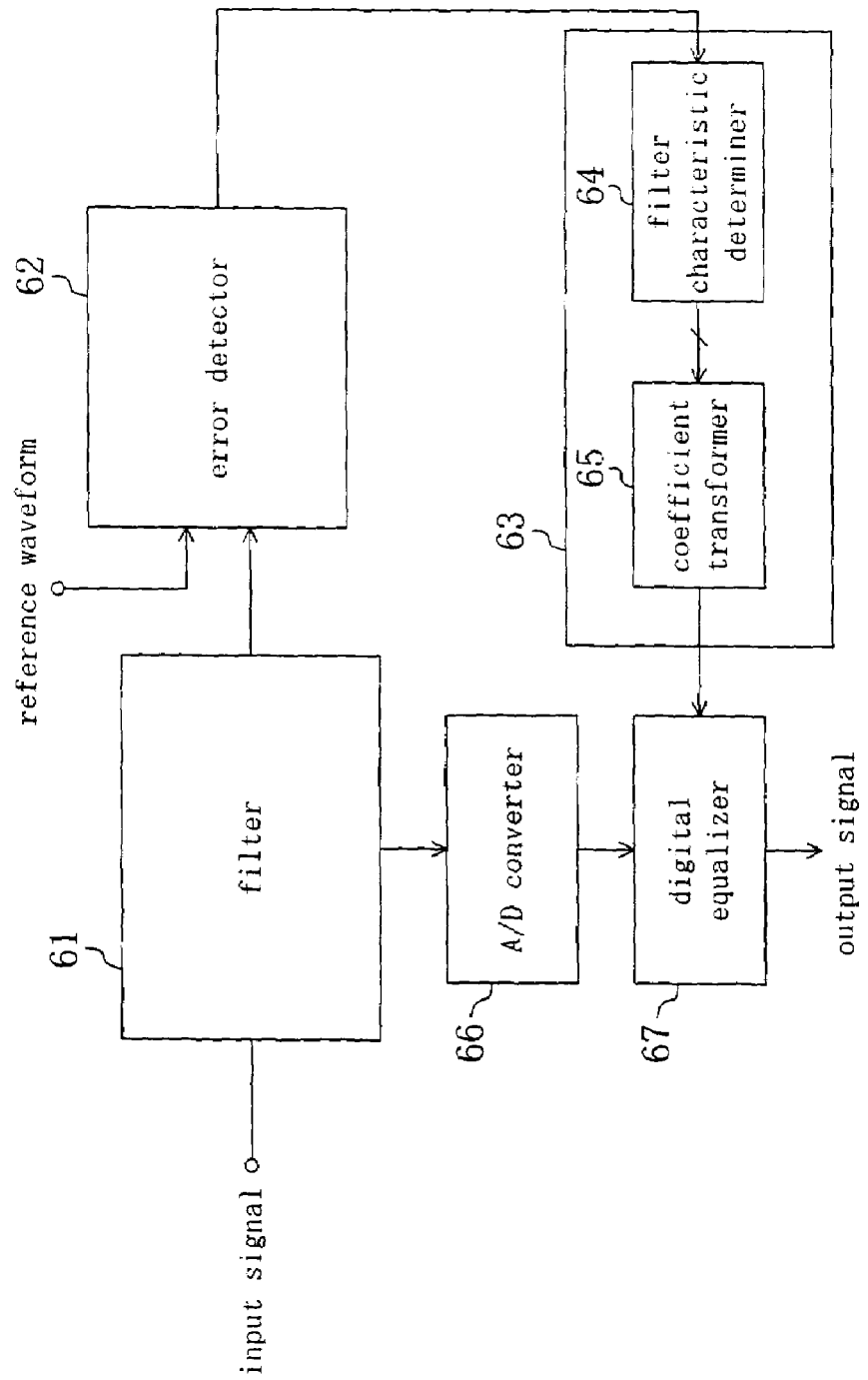
FIG. 9 illustrates a configuration for a prior art equalizer including a digital circuit.

FIG. 9 illustrates, as a comparative example, a configuration for a prior art equalizer circuit including a digital circuit. As shown in FIG. 9, the prior art equalizer circuit additionally needs an A/D converter 66 and a digital equalizer 67, thus dissipating more power than the analog equalizer of the present invention.

Figure 10:
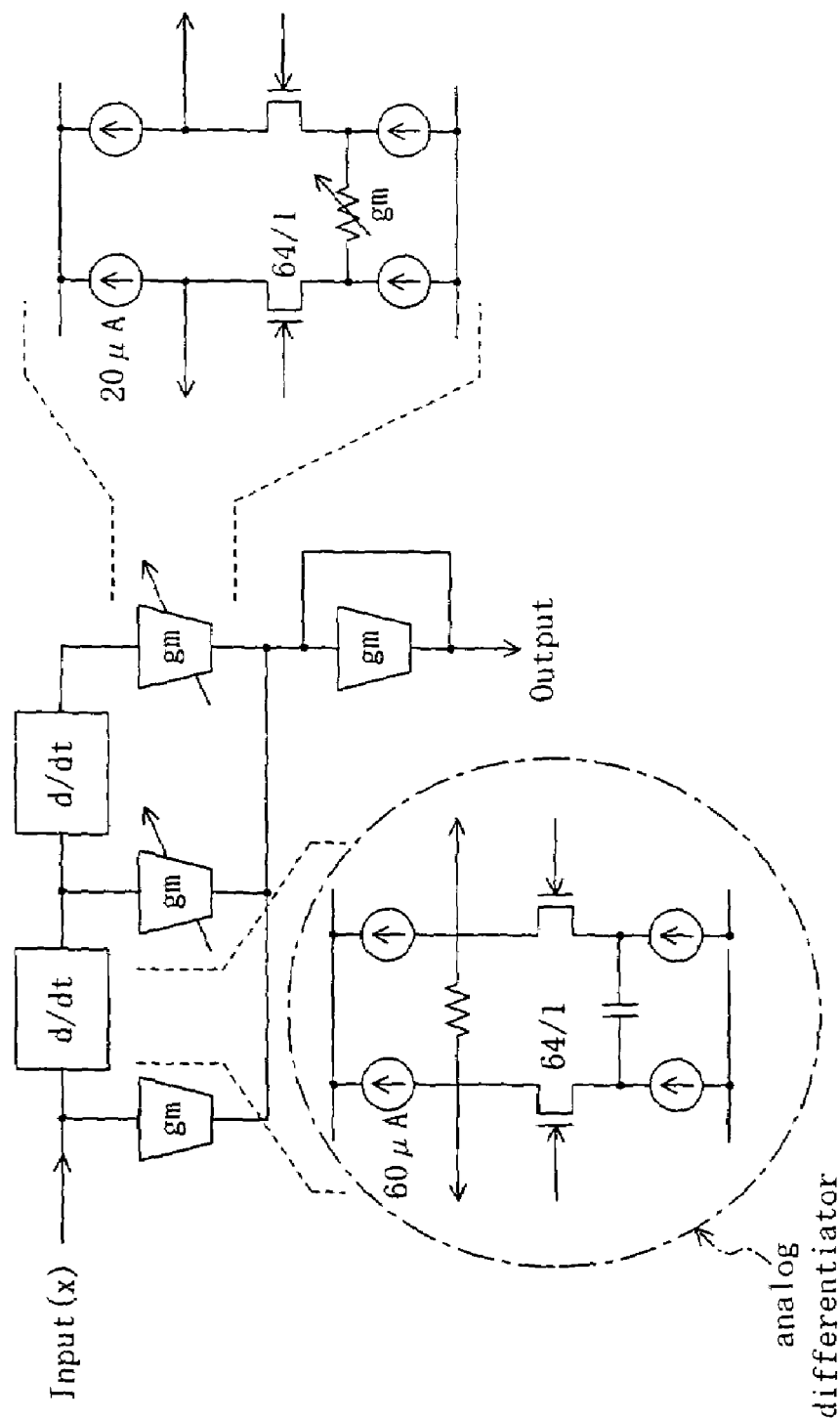
FIG. 10 illustrates a configuration for another conventional analog equalizer.

FIG. 10 illustrates, as another comparative example, a configuration for another analog equalizer circuit (see, for example, "A 160 MHz Analog Front-End IC for EPR-IV PRML Magnetic Storage Read Channels", P. Pai, A. Brewster and A. A. Abidi, IEEE J. of Solid-State Circuits, pp. 1803-1816, November, 1996). In the analog equalizer circuit shown in FIG. 10, an analog differentiator is cascaded with a conventional filter circuit. However, it is usually difficult to design a differentiator using analog components.

In contrast, according to this embodiment, an analog equalizer circuit is implementable just by providing another input terminal for the ladder filter separately from an ordinary signal input terminal and by inputting a signal through this additional input terminal to the respective voltage-controlled current sources by way of the gain converters. Thus, there is no need to add the differentiator or the like circuit hard to implement with analog components. Furthermore, according to this embodiment, an equalizer circuit can be constructed using the ladder filter with the consistent characteristic. As a result, the characteristic of the equalizer circuit can be further stabilized.

The analog equalizer according to this embodiment is easily applicable to a signal readout system for use in magnetic or magneto-optical recording by a partial response maximum likelihood (PRML) method, in which Viterbi decoding and partial response (PR) equivalent transformation are used in combination.

The PRML method is a promising signal reading method, because the SNR of the read signal can be improved compared to conventional magnetic recording techniques using a data slicer. Accordingly, a magnetic or magneto-optical disk signal readout system including the analog equalizer of the present invention can have its digital circuit section downsized compared to the conventional signal readout system including the digital equalizer. Thus, the present invention contributes to reduction in power dissipated and circuit size.

Figure 11:
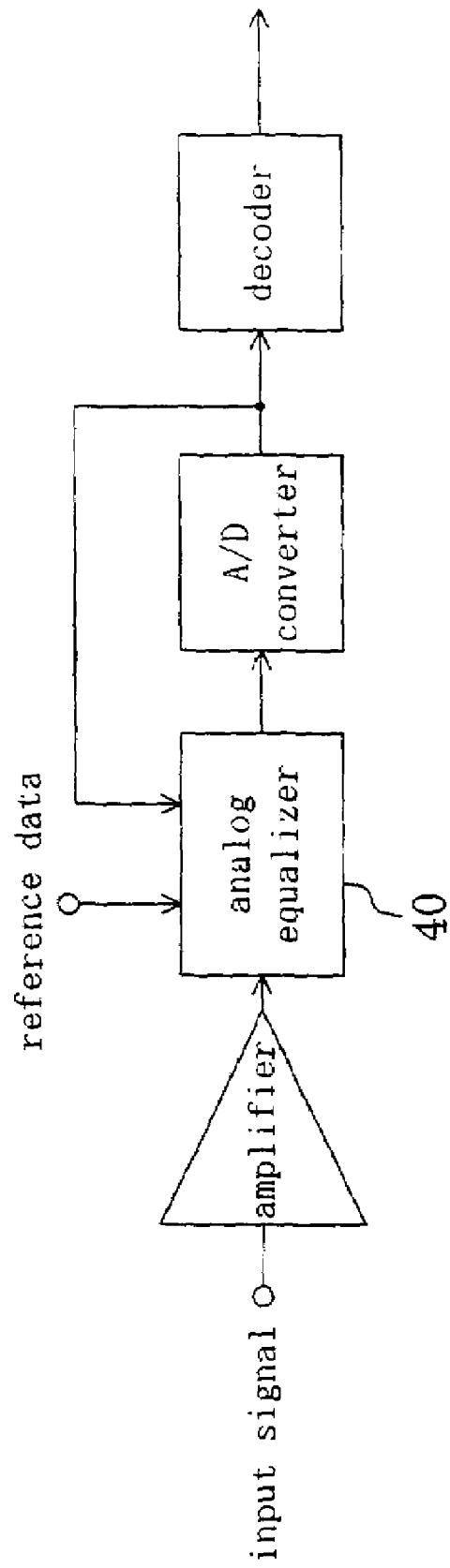
FIG. 11 is a block diagram illustrating a configuration for a magnetic or magnet-optical disk signal readout system including the analog equalizer according to the third embodiment.
Figure 12:
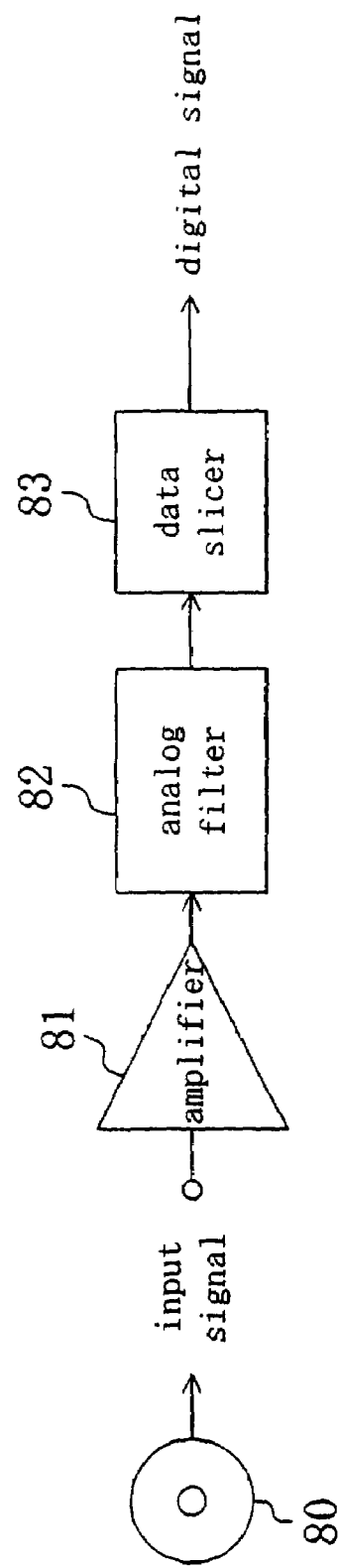
FIG. 12 is a block diagram illustrating a configuration for a known magnetic or magneto-optical disk signal readout system.
Figure 13:
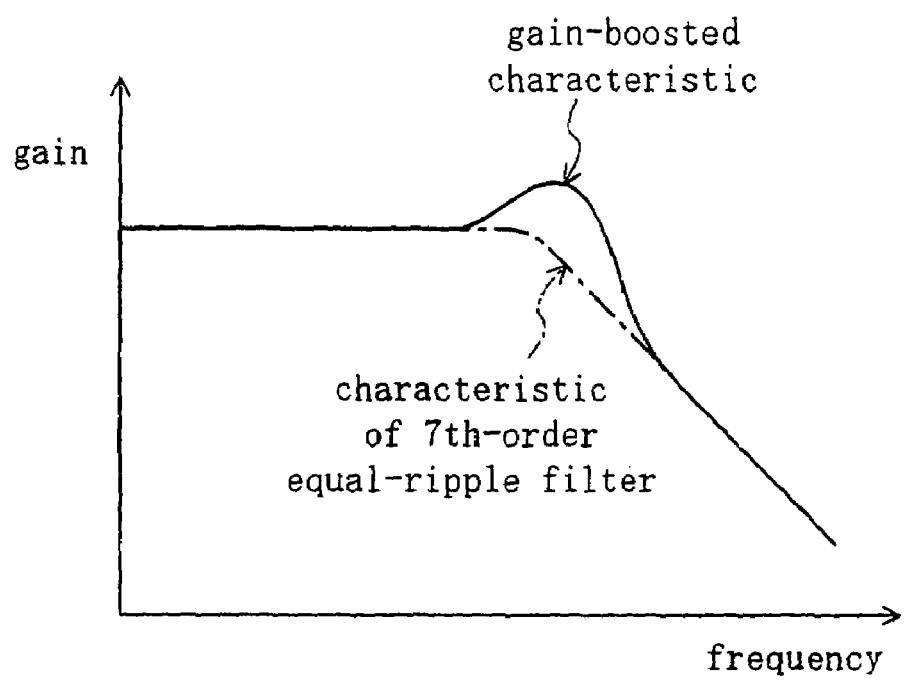
FIG. 13 illustrates an ordinary frequency characteristic of an analog filter for use in a signal readout system.
Figure 14:
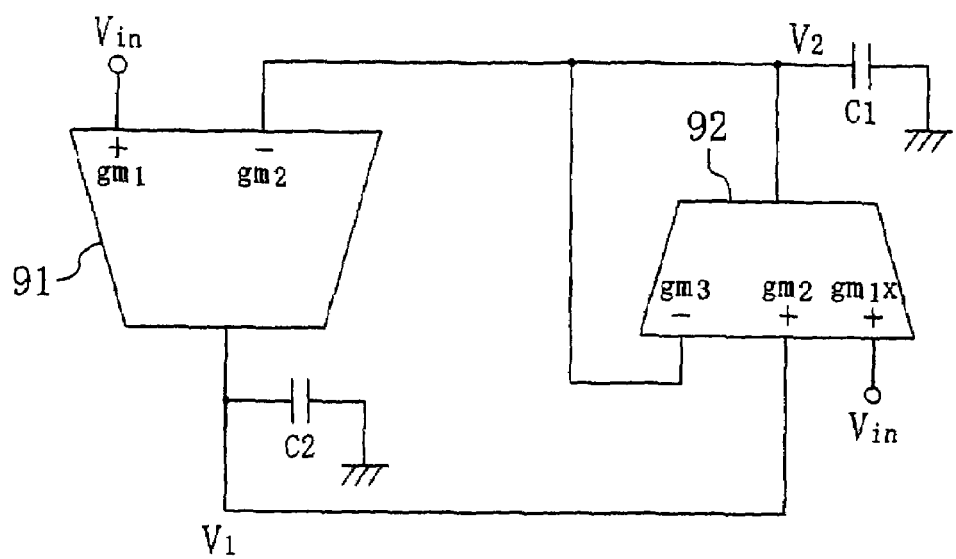
FIG. 14 illustrates exemplary biquadratic filters.
Figure 15:
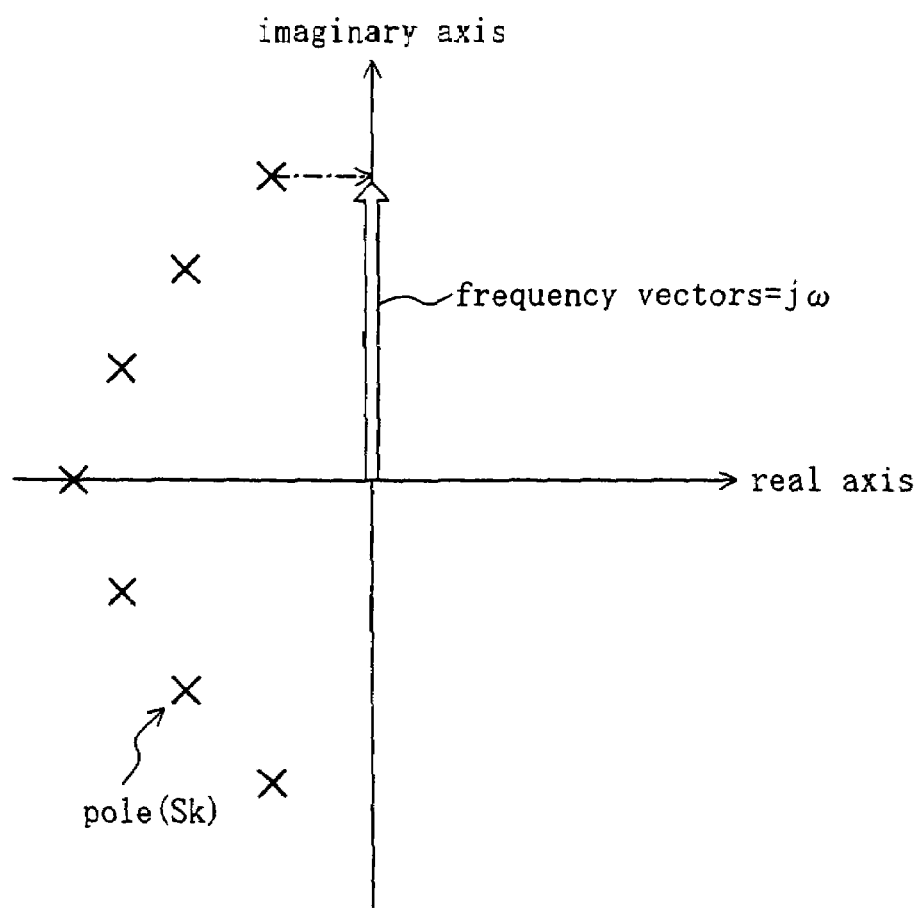
FIG. 15 illustrates a Laplace plane representing the characteristic of an analog filter.
Figure 16A:
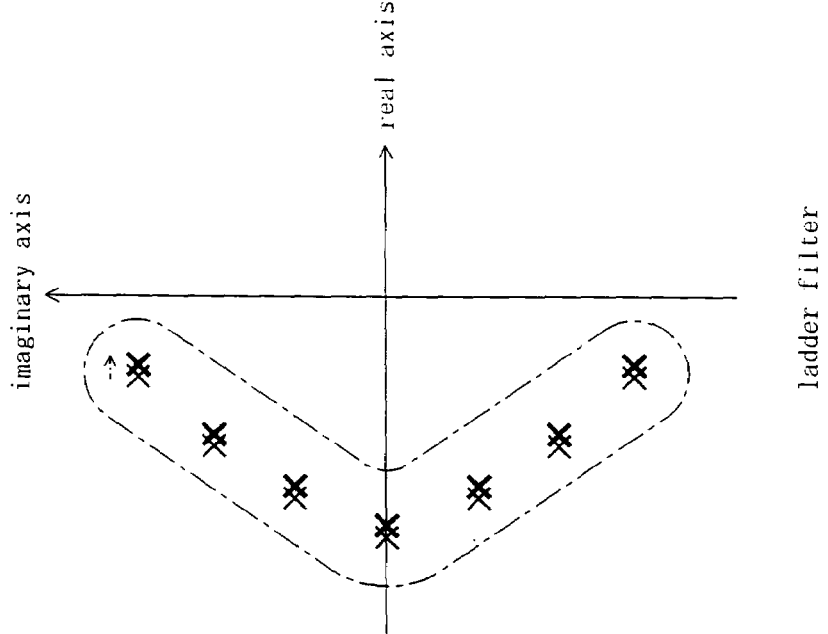
FIG. 16($a$) illustrates the characteristic of a filter network implemented as a cascade of biquadratic filters.
Figure 16B:
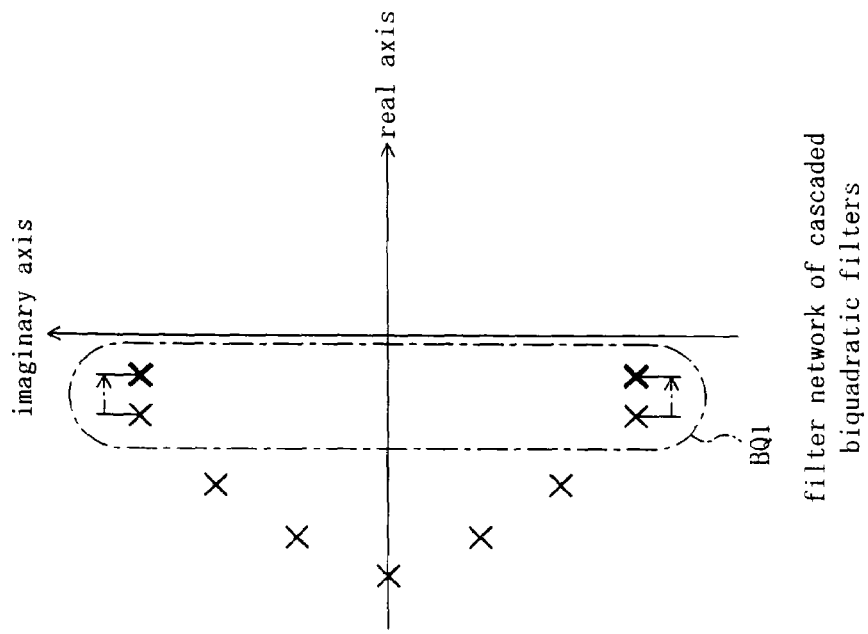

FIG. 11 illustrates a configuration for a magnetic or magnet-optical disk signal readout system including the analog equalizer according to the third embodiment. As shown in FIG. 11, the system includes an analog equalizer 40 with the configuration shown in FIG. 9. The analog equalizer 40 can function by itself not only as an equalizer but also as a low-pass filter as well.

In the conventional signal readout system for use in PRML magnetic or magneto-optical recording, the equalizer often includes a digital filter. This is because no analog equalizers, qualified for the signal readout system, have been available so far. In contrast, the analog equalizer according to this embodiment uses the ladder filter with a low sensitivity as a basic circuit component and needs no differentiator that is hard to implement using analog components. Thus, compared to the conventional analog equalizer, the inventive analog equalizer attains much higher precision and requires much less area and power. Furthermore, an analog equalizer can reduce power dissipation more easily than a digital equalizer generally speaking.

Accordingly, a signal readout system including the analog equalizer of the present invention is much more advantageous in precision, area and power dissipation. It should be noted that the same effects are also attainable by applying the inventive analog equalizer to any system for reading out a signal from a recording medium other than a magnetic or magneto-optical disk.

As described above, the inventive ladder filter exhibits a filter characteristic highly consistent even against the characteristic variations of its components and provides its input signal to at least one of the voltage-controlled current sources for inductor sections via gain adjusting means. As a result, even a transfer function that has been hard to realize in the conventional filters is realizable. For example, by setting the ratio of the gains obtained by the gain adjusting means to such a value that the transfer function of the ladder filter has a numerator $(1+s^2)$, a desired gain-boosted characteristic is realizable independent of its phase characteristic.

In addition, by using such a filter, a downsized analog equalizer with stabilized characteristics can be obtained. Furthermore, a signal readout system including an analog equalizer like this is much more advantageous in precision, area and power dissipation.

What is claimed is:

1. An analog equalizer comprising:
    a ladder filter including multiple inductor sections, each said inductor section being implemented by an equivalent circuit including voltage-controlled current sources and capacitors;
    means for detecting an error between an output signal of the ladder filter and a reference signal; and
    means for changing a filter characteristic of the ladder filter by reference to the error that has been detected by the detecting means,
    wherein a signal input to the ladder filter is provided to at least one of the voltage-controlled current sources by way of gain adjusting means, which obtains a variable gain, and
    wherein the changing means changes the gain, obtained by the gain adjusting means of the ladder filter, based on the error that has been detected by the detecting means.

2. A signal readout system comprising the analog equalizer as recited in claim 1,
    wherein the system reads out a signal from a recording medium such as a magnetic or magneto-optical disk and filters the signal using the analog equalizer.

* * * * *